Figure 1A:
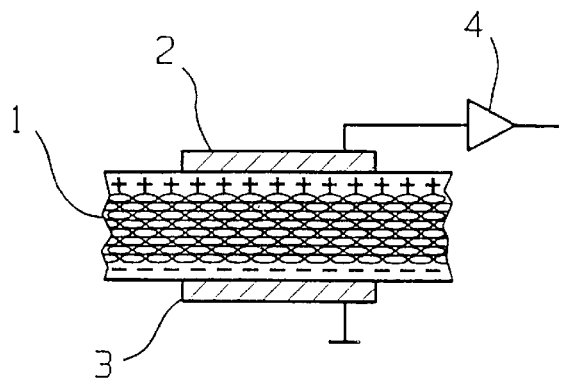

United States Patent

Ojala et al.

[11] Patent Number: 5,917,437
[45] Date of Patent: Jun. 29, 1999

[54] KEYBOARD

[75] Inventors: Jukka Ojala; Lasse Räisänen, both of Oulu, Finland

[73] Assignee: Screentec Ky, Finland

[21] Appl. No.: 08/860,521

[22] PCT Filed: Dec. 27, 1995

[86] PCT No.: PCT/FI95/00709

§ 371 Date: Nov. 21, 1997

§ 102(e) Date: Nov. 21, 1997

[87] PCT Pub. No.: WO96/20533

PCT Pub. Date: Jul. 4, 1996

[30] Foreign Application Priority Data

Dec. 28, 1994 [FI] Finland ................................. 946111
Jun. 1, 1995 [FI] Finland ................................. 952667

[51] Int. Cl.$^6$ ................................................. G11C 13/02
[52] U.S. Cl. ......................... 341/34; 707/400; 341/20; 341/21; 341/22; 341/33; 341/34; 310/366; 310/340; 310/363; 200/5 A; 200/512; 178/18; 345/173; 307/400
[58] Field of Search ................................. 341/5, 20, 21, 341/22, 33, 34; 310/339, 366, 340, 363; 200/5 A, 512; 178/18; 345/173; 307/400

[56] References Cited

U.S. PATENT DOCUMENTS

| | | | |
|---|---|---|---|
| 3,925,610 | 12/1975 | French | 178/18 |
| 4,057,660 | 11/1977 | Yoshida | 427/100 |
| 4,633,123 | 12/1986 | Radice | 310/339 |
| 4,654,546 | 3/1987 | Kirjavainen | 307/400 |
| 4,857,887 | 8/1989 | Iten | 341/34 |
| 4,975,616 | 12/1990 | Park | 310/339 |

FOREIGN PATENT DOCUMENTS

| | | |
|---|---|---|
| 0 107 318 | 5/1984 | European Pat. Off. . |
| 0 203 261 | 12/1986 | European Pat. Off. . |
| 0 210 386 | 2/1987 | European Pat. Off. . |
| 0 254 966 | 2/1988 | European Pat. Off. . |
| 0 472 888 | 3/1992 | European Pat. Off. . |
| 0 489 344 | 6/1992 | European Pat. Off. . |
| 71267 | 9/1986 | Finland . |
| 76225 | 5/1988 | Finland . |
| 913741 | 8/1991 | Finland . |
| 2 157 080 | 10/1985 | United Kingdom . |
| 2 222 014 | 2/1990 | United Kingdom . |

*Primary Examiner*—Michael Horabik
*Assistant Examiner*—Albert K. Wong
*Attorney, Agent, or Firm*—Medlen & Carroll, LLP

[57] ABSTRACT

A keyboard according to the present invention, which includes one or more keys and corresponding electromechanical converting elements, is characterized in that it includes a film construction (42) which includes an electret film with a bubble construction known as EMF by which said electromechanical converting elements corresponding to the keys are formed, and a solid, stiff cover plate (43) which covers the EMF construction (42) and in which an area (A–D) in the vicinity of each electromechanical converting element forms a key. In one embodiment of the present invention, a frame of the keyboard forms the cover plate and the EMF construction affixed behind the cover plate is covered with a sufficiently thick and stiff layer of plastic. The cover plate may be steel or aluminum, for example, and other materials such as plastic, glass or ceramic materials can be used. The thickness of the cover plate may be approximately 2 mm, for example. By means of the present invention, it is possible to manufacture mechanically, chemically and electromagnetically extremely well-shielded keyboards which are suitable for adverse operating conditions and withstand vandalism.

14 Claims, 3 Drawing Sheets

KEYBOARD

The present invention is related to a keyboard which comprises one or more keys and their corresponding electromechanical converting means, and in particular, the present invention is related to a keyboard in which said electromechanical converting means are realized using a polymer film.

Piezoelectric films can be manufactured from certain polymer materials by means of a manufacturing process whereby said material is polarized by changing the orientation of crystals contained in said material by using both a mechanical procedure and a strong electric field. The best known film used in keyboards is polyvinylidene film, or PVDF, which is commercially available under several brand names. A PVDF switch element can be produced, for example, by silk-screening electrodes onto both charged surfaces of the film and connecting to said electrodes circuitry which conducts current produced in said film when a key is pressed to a control unit which detects said key. Keyboards based on the use of PVDF are presented in publications EP-A2 203 261 and GB-B 2 222 014, of which the first deals especially with wiring methods which improve noise resistance and the second with realization of converting elements.

One film which functions as an electromechanical converting means is an electret film with a bubble construction which is known as electromechanical film, or EMF. This Finnish invention and its variations and methods of manufacture is presented in patent publications FI 71267 and FI 76225 and patent application FI 913741. The film material is an insulator, such as polypropene, which contains gas-filled cells produced by means of a special method and a permanent electric charge is injected in the surface of said cells. A change in the thickness of the film, such as is caused by pressure, creates a current pulse which can be detected via electrodes attached to the surface of said film.

The idea of applying EMF to keyboards is rather obvious to a person skilled in the art, and said idea is referred to, for example, in the patent publication FI 71267 mentioned above. EMF is less costly to produce than PVDF and, in principle, a corresponding noise resistant converting element can be produced with EMF as with PVDF. For example, polypropene-based EMF is characterized in that it is very flexible and naturally lightweight due to its bubble construction. The sensitivity of EMF as an electromechanical converting means is also good. Also, very thin structures can be realized with EMF. The film can be as thin as 40 $\mu$m, for example. The disadvantage of said polypropene-based EMF is its poor mechanical durability. To our knowledge, this apparently is the reason why EMF has not been used in keyboard applications.

In studying possibilities of using flexible, lightweight and thin EMF in keyboard realizations, we came upon a surprising discovery that, with certain applications in mind, an extremely advantageous solution is obtained by combining said flexible, lightweight and thin EMF construction with a relatively stiff and massive cover plate.

A keyboard according to the invention, including a solid, stiff cover plate, keys, each of which is formed by an area on a first side of the cover plate, and electromechanical converting means corresponding to each key area, is characterized in that electromechanical converting means for the key areas are formed by one common film construction attached on the second side, opposite to the first side, of the cover plate and including an electret film with a bubble construction known as EMF, and circuit pattern on said EMF film for forming electrodes for each converting means.

The EMF construction may be directly or via a thin intermediate layer against a base.

In one advantageous embodiment of the keyboard according to the invention the cover plate also forms a frame of said keyboard. The base may be a plastic layer cast on the cover plate which together with said cover plate tightly surrounds the EMF construction.

In another advantageous embodiment the base also forms a frame of said keyboard.

The material of the cover plate may be one of the following: metal, such as aluminum or steel, plastic, glass or ceramic material.

In one embodiment of the invention the thickness of the cover plate is approximately 2 mm. The EMF construction may be fastened to a base which is formed by an approximately 4 mm thick steel plate, and also the cover plate may be made of steel.

In further embodiments of the invention there may be a layer of glue or a layer of air between the EMF construction and the cover plate.

In a further embodiment of the invention the cover plate may include a liquid crystal display device.

It is clear that this construction forms a mechanically and chemically extremely well-shielded keyboard. When metal plates are used as a cover and as a base shielding against electromagnetic disturbances is excellent. Furthermore, this keyboard withstands very large and rapid temperature changes. Converting elements can be produced very advantageously by using EMF. This solution makes it possible to introduce inexpensive keyboards to the market which are intended for extremely difficult environments and which withstand vandalism. A keyboard according to this invention can be applied to many different purposes. The cover plate and base material can be selected from numerous alternatives depending on the application. Due to the thinness of the EMF construction, a keyboard according to this invention can be realized as a relatively thin keyboard unit regardless of the stiff and massive cover plate construction.

The present invention and its various embodiments are described in the following, with references to the enclosed drawings.

Figure 1B:
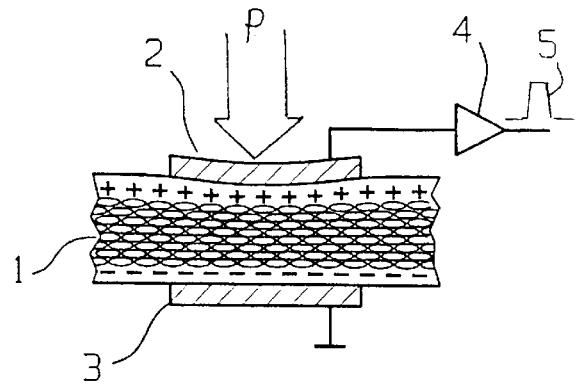
Figure 2:
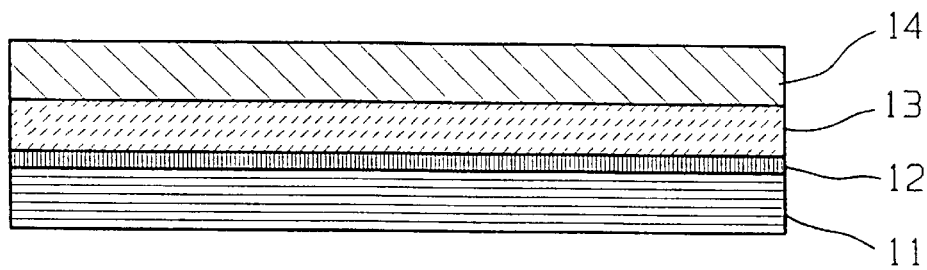
Figure 3:
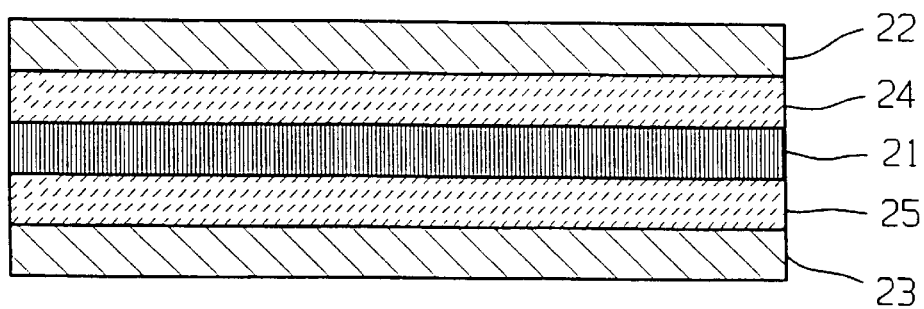
Figure 4:
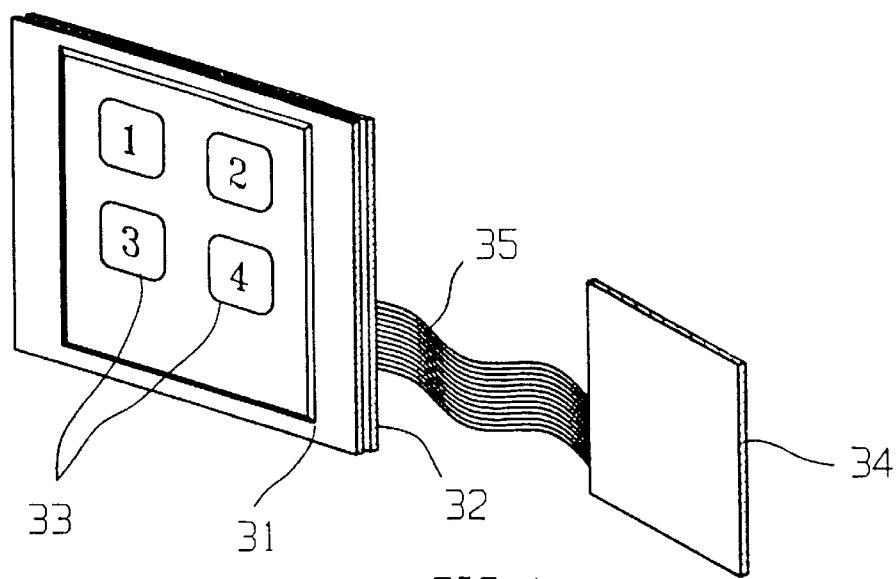
Figure 5:
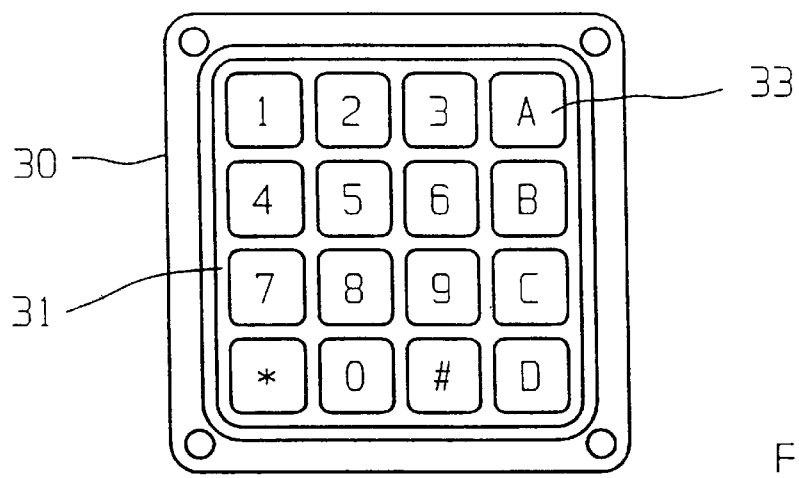
Figure 6:
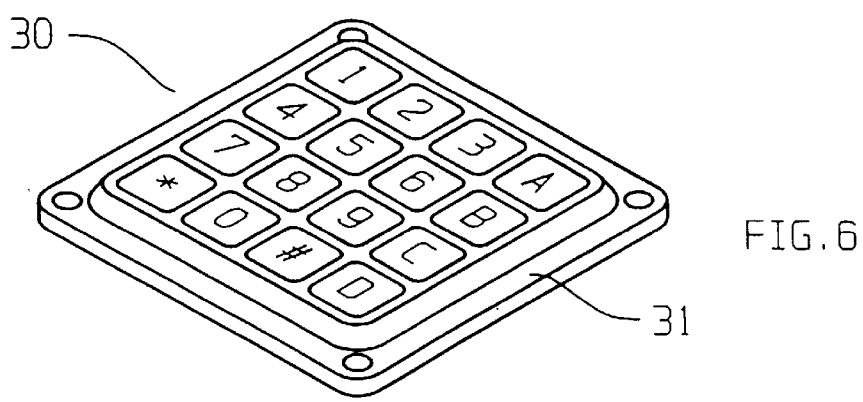
Figure 7:
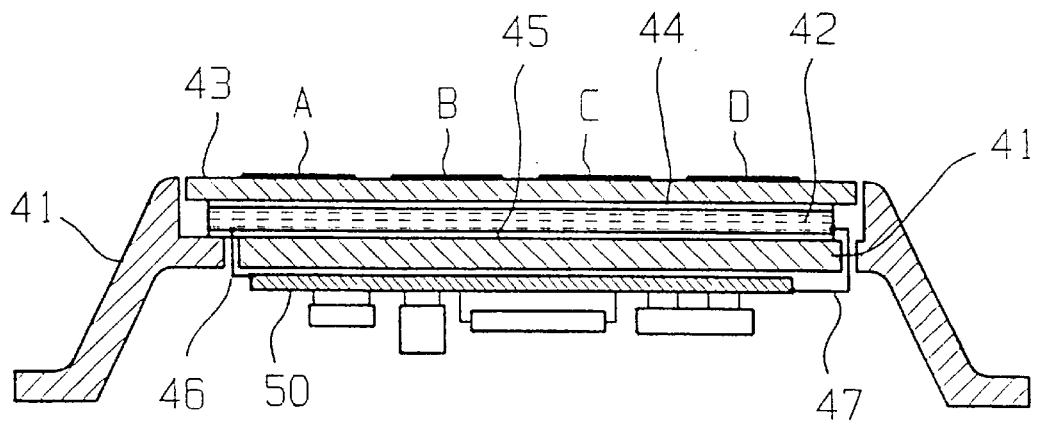
Figure 8:
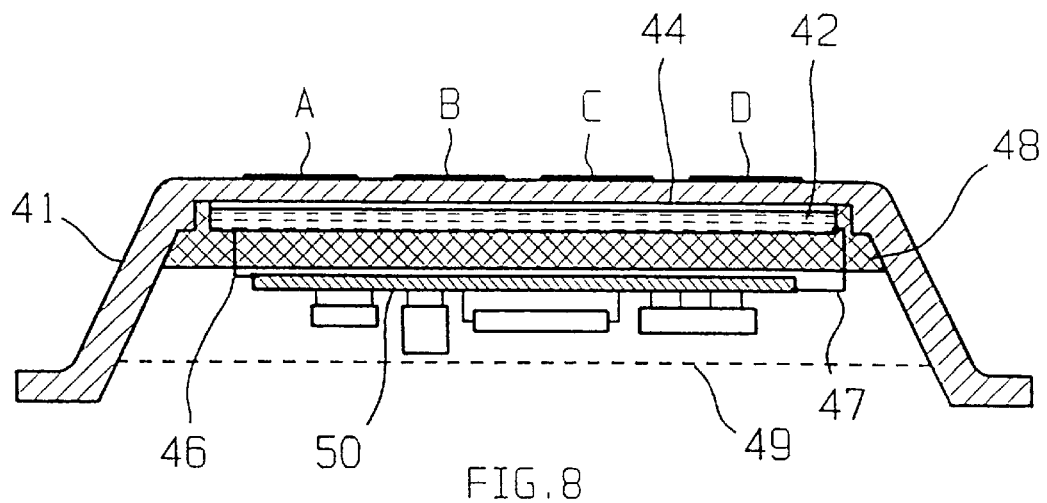

FIG. 1(*a*) and FIG. 1(*b*) shows a schematic representation of an electromechanical converting element realized by means of EMF and the functioning of said element, FIG. 2 shows a schematic cross-section of a possible construction of a keyboard according to this invention, FIG. 3 shows a schematic cross-section of another possible construction of a keyboard according to this invention, FIG. 4 shows a schematic representation of a possible application of a keyboard according to this invention, FIGS. 5 and 6 respectively show top and perspective views of an application of a keyboard according to this invention, FIG. 7 shows a schematic representation of an embodiment of a keyboard according to this invention and, FIG. 8 shows a schematic representation of another embodiment of a keyboard according to this invention.

FIGS. 1(*a*) and 1(*b*) show schematic representations of an electromechanical converting element realized by means of EMF and the functioning of said element. Charges are injected in EMF with a bubble construction 1 so that one surface is positively charged and the other surface is negatively charged, and said surfaces are provided with electrodes 2 and 3. The electrodes advantageously are produced by silk screening and in the most commonly used configuration the second electrode 3 generally forms a common ground plane for all converting elements. When pressure P is exerted on the converting element according to FIG. 1(b), a current pulse 5 from the electrode 2 is obtained by means of an amplifier 4 and may then be detected. A detectable change in the thickness of the EMF may be only a few micrometers. A person skilled in the art understands that in practical applications, several layers of circuits separated by insulating material may be needed to produce the converting element electrodes and their circuitry, and that for various reasons, the construction may also include layers of material other than those related to the electrodes and their circuitry. The electrode or ground plane on the second surface of the film also may by formed by a conductive frame of the keyboard against which the EMF lays or to which it is glued.

A possible construction of a keyboard according to this invention is presented in the following with references to FIGS. 2 and 3, while noting that said figures are only illustrative and that, for example, the relative thicknesses of the films and other constructions are completely different in practical applications. The same notation also holds true for the other figures in which constructions are presented schematically.

In FIG. 2 the lowest layer of the keyboard structure consists of EMF 11 which has a circuit pattern 12 screened on its upper surface to form electrodes of a membrane switch. An insulating layer 13 is on top of the film and a cover plate 14 is on top of the insulating layer. According to this invention, the cover plate may be a stiff, solid plate which covers the whole keyboard. When a key, an area on the cover plate, is pressed, the force causes a sufficient change in the thickness of the film to produce a signal. The insulating layer 13 may be made from polyester film or glass, for example. The insulating layer 13 may also be left out completely if the cover plate 14 is made from an insulating material such as hard plastic.

In one embodiment the cover plate material is steel and the insulating layer 13 is an air space, providing an extremely durable construction which is inexpensive to manufacture. Tests have indicated that a 1 mm air space is functionable if the film is in an enclosure.

FIG. 3 presents a cross-section of a sandwich-type keyboard structure in which the EMF structure 21 is located between two stiff plates 22 and 23, of which one functions as a cover plate and the other as a base plate. If the stiff plates 22, 23 are conductive, insulating layers 24 and 25 may be placed on both sides of the film construction 21. The insulating material may be glass, polyester film, a suitable layer of glue or air, for example.

FIG. 4 presents a practical application of the sandwich construction. The cover plate 31 and the background plate 32 are made from 2 mm steel plate. Keys 33 are marked on the cover plate 31. Electronic control circuitry is located in a separate control unit 34. The film construction and control unit are connected by a cable 35. In this type of embodiment the keyboard can easily be made water and dust tight and capable of withstanding rough handling. When the electronic control circuitry is located elsewhere, a mechanically and chemically durable keyboard can be manufactured as a relatively thin unit, in this case approximately 5 mm thick.

FIGS. 5 and 6 respectively present top and perspective views of another application of a keyboard according to this invention. In this case, the keyboard unit 30 also includes electronic control circuitry in the same enclosure. The keyboard unit may be made from aluminum, for example, with a construction which is approximately 4 mm thick. The thickness of the cover plate is approximately 2 mm. In a practical realization, the length of a side of the keyboard unit could be 100 mm, for example. When viewed outwardly, the keyboard unit appears as a solid, massive unit whose cover plate 31 contains key areas 33. The cover plate can be the frame of the keyboard unit, whereupon the keyboard unit appears as a completely solid piece of metal when viewed from above, as presented in FIG. 6.

FIGS. 7 and 8 present schematic cross-sections of embodiments of a keyboard according to this invention which realize keyboard units such as those presented in FIGS. 5 and 6. In the embodiment shown in FIG. 7, a frame 41 functions as a base, and an EMF construction 42 and cover plate 43 are placed in an indentation in said frame, so that the surface of the resulting keyboard unit is even. The cover plate 43 contains key areas A, B, C, D. The EMF construction may be fastened to the cover plate with a layer of glue 44 and to the base 41 also with a layer of glue 45. In principle, the layers of glue 44 and 45 can also be layers of air or layers of insulation between the cover plate and the EMF construction. The base formed by the frame 41 has holes through which wires 46 and 47 are routed to the electronic unit 50.

In the embodiment shown in FIG. 8, the frame 41 is slightly thinner in the vicinity of the EMF construction 42, and the frame, which contains key areas A, B, C, D, functions as a cover plate. The EMF construction may be fastened to the frame 41 with a layer of glue 44. A relatively thick and sturdy layer of cast plastic 48, such as epoxy, functions as a base which covers the EMF construction 42 and tightly surrounds it together with the frame 41. The plastic layer 48, which may be a few millimeters thick and which must be sufficiently stiff, sufficiently resists a force exerted on the opposite side of the EMF construction at the location of a converting element to cause the EMF to be slightly compressed and thus produce a detectable signal. Wires 46 and 47 to the electronic unit 50 pass through the cast plastic layer. The plastic layer can be cast thick enough to cover and enclose the electronic unit 50 as depicted by the dotted line 49 in the figure. This provides a simple way to produce a sturdy and durable keyboard unit which is well sealed and shielded from environmental effects. A keyboard can be realized in this manner just as easily on a glass or plastic base.

The applications of a keyboard according to this invention are especially devices which are installed in public places or commercial buildings where they may be subjected to weather changes, mechanical force or vandalism. In addition to steel, suitable cover plate materials include other metals, such as aluminum, ceramic materials, glass and plastic. The thickness of the cover plate and other dimensions presented above are only examples, but they illustate what is meant by the term "stiff cover plate" in the definition of the invention. It is essential in a keyboard according to this invention that it incorporates an EMF construction and a stiff and, compared to conventional keyboard constructions and display dimensions, massive cover plate.

One possibility is to place the EMF construction behind a liquid crystal display so that the cover plate includes an LCD device. This provides a way to realize a simple, functional touch-sensitive display.

A keyboard with a construction according to this invention and suitably selected insulating material will withstand even large, abrupt changes in temperature without malfunctioning.

As stated above, a keyboard according to this invention can be built relatively thin. The thickness of a construction according to FIGS. 3 and 4 could be as thin as 3 mm if the cover and background plates are made of steel and the insulating layers are made of polyester film, for example. A keyboard can also be realized with desired surface forms by using elastic EMF as the switch membrane.

The present invention is not limited to the examples presented above, but rather it can vary to the extent allowed by the enclosed claims.

We claim:

1. A keyboard, comprising:
   i) a solid, stiff cover plate having a first side and a second side opposite said first side;
   ii) a plurality of keys, wherein each of said keys is formed by an area on said first side of said cover plate; and
   iii) electromechanical converting elements, wherein said electromechanical converting elements are formed by one common electromechanical film and a circuit pattern on said electromechanical film, wherein said electromechanical film is attached to said second side of said cover plate, wherein said electromechanical film is thin compared to said cover plate, and wherein said electromechanical film is flexible.

2. The keyboard according to claim 1, wherein said electromechanical film is attached directly against said cover plate.

3. The keyboard according to claim 1, wherein a layer of glue is between said electromechanical film and said cover plate.

4. The keyboard according to claim 1, wherein a layer of air is between said electromechanical film and said cover plate.

5. The keyboard according to claim 1, further comprising a base, wherein said electromechanical film is directly against said base.

6. The keyboard according to claim 1, wherein said cover plate forms a frame of said keyboard.

7. The keyboard according to claim 5, wherein said base is a plastic layer cast on said cover plate, wherein said base and said cover plate tightly surrounds said electromechanical film.

8. The keyboard according to claim 5, wherein said base forms a frame of said keyboard.

9. The keyboard according to claim 1, wherein said cover plate comprises material selected from the group consisting of metal, plastic, glass, and ceramic.

10. The keyboard according to claim 1, wherein said cover plate has a thickness of about 2 mm.

11. The keyboard according to claim 1, wherein said cover plate further comprises a liquid crystal display device.

12. The keyboard according to claim 1, further comprising an insulating layer, wherein said insulating layer is on top of said electromechanical film, wherein said cover plate is on top of said insulating layer, and wherein said insulating layer comprises material selected from the group consisting of glass and polyester film.

13. The keyboard according to claim 5, further comprising a thin intermediate layer, wherein said thin intermediate layer is between said electromechanical film and said base.

14. The keyboard according to claim 9, wherein said metal is selected from the group consisting of aluminum and steel.

* * * * *